US012384620B2

(12) United States Patent
Ito

(10) Patent No.: US 12,384,620 B2
(45) Date of Patent: Aug. 12, 2025

(54) OVERHEAD CARRIER AND OVERHEAD CARRYING SYSTEM

(71) Applicant: MURATA MACHINERY, LTD., Kyoto (JP)

(72) Inventor: Yasuhisa Ito, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 545 days.

(21) Appl. No.: 17/996,564

(22) PCT Filed: Feb. 15, 2021

(86) PCT No.: PCT/JP2021/005478
§ 371 (c)(1),
(2) Date: Oct. 19, 2022

(87) PCT Pub. No.: WO2021/220582
PCT Pub. Date: Nov. 4, 2021

(65) Prior Publication Data
US 2023/0118995 A1    Apr. 20, 2023

(30) Foreign Application Priority Data

Apr. 27, 2020    (JP) .................................. 2020-078157

(51) Int. Cl.
 *B65G 1/04*    (2006.01)
 *B65G 49/07*   (2006.01)
 *H01L 21/677*  (2006.01)

(52) U.S. Cl.
CPC ......... *B65G 1/0464* (2013.01); *B65G 1/0457* (2013.01); *B65G 49/07* (2013.01);
(Continued)

(58) Field of Classification Search
CPC ........ B65G 1/0464; B65G 49/07; B65G 1/04; B65G 1/0457; B65G 2201/0297;
(Continued)

(56) References Cited

U.S. PATENT DOCUMENTS

2006/0219126 A1* 10/2006 Nakao .................... B65G 37/02
                                                104/106
2015/0332948 A1* 11/2015 Ikeda ................ H01L 21/67736
                                                700/230
(Continued)

FOREIGN PATENT DOCUMENTS

CN          110937386 A     3/2020
KR    10-2014-0141827 A    12/2014
(Continued)

OTHER PUBLICATIONS

International Search Report in International Appln. No. PCT/JP2021/005478, dated Apr. 27, 2021, 4 pages (with English Translation).
(Continued)

*Primary Examiner* — Thomas Randazzo
(74) *Attorney, Agent, or Firm* — Keating & Bennett, LLP

(57) ABSTRACT

An overhead transport vehicle includes: an article holding unit configured to hold an article; a linear drive unit configured to drive the article holding unit to move linearly; a pivoting drive unit configured to drive the article holding unit to pivot horizontally; and a control unit configured to control the pivoting drive unit in accordance with orientation of the article held by the article holding unit and orientation of a load port on which the article is placed.

5 Claims, 12 Drawing Sheets

(52) U.S. Cl.
CPC ...... *H01L 21/677* (2013.01); *H01L 21/67724* (2013.01); *H01L 21/67727* (2013.01); *H01L 21/6773* (2013.01); *H01L 21/67733* (2013.01); *H01L 21/67736* (2013.01)

(58) Field of Classification Search
CPC ............. H01L 21/677; H01L 21/67724; H01L 21/67727; H01L 21/6773; H01L 21/67733; H01L 21/67736; H01L 21/67706; B61B 13/00; B61B 3/02; B61D 47/00
See application file for complete search history.

(56) References Cited

U.S. PATENT DOCUMENTS

| | | | |
|---|---|---|---|
| 2019/0189488 A1* | 6/2019 | Ito | ............................. B61B 3/02 |
| 2020/0203203 A1* | 6/2020 | Ito | ..................... H01L 21/67736 |
| 2020/0251366 A1* | 8/2020 | Wada | ................. H01L 21/67733 |
| 2021/0136648 A1* | 5/2021 | Kuwahara | ............ H04W 36/322 |
| 2021/0162850 A1* | 6/2021 | Ogo | ......................... B60L 53/31 |

FOREIGN PATENT DOCUMENTS

| | | |
|---|---|---|
| WO | WO 2015/174181 | 11/2015 |
| WO | WO 2018/037762 | 3/2018 |

OTHER PUBLICATIONS

Official Communication issued in corresponding Singaporean Patent Application No. 11202254375W, mailed on Jul. 28, 2023.

* cited by examiner

OVERHEAD CARRIER AND OVERHEAD CARRYING SYSTEM

CROSS-REFERENCE TO RELATED APPLICATIONS

This application is a National Stage Application under 35 U.S.C. § 371 and claims the benefit of International Application No. PCT/JP2021/005478, filed Feb. 15, 2021, which claims priority to JP Patent Application Serial No. 2020-078157, filed on Apr. 27, 2020. The entire contents of which are incorporated herein by reference.

TECHNICAL FIELD

An aspect of the present invention relates to an overhead transport vehicle and an overhead transport system.

BACKGROUND ART

As a technology related to overhead transport vehicles, a rail-guided trolley described in Patent Literature 1, for example, is known.

The rail-guided trolley described in Patent Literature 1 includes a body section configured to convey an article along a rail including a portion arranged in a grid pattern while holding it below the rail.

CITATION LIST

Patent Literature

[Patent Literature 1] International Publication No. WO 2018/037762

SUMMARY OF INVENTION

Technical Problem

In the overhead transport vehicle described above, depending on the orientation of an article held by an article holding unit, it may be difficult to transfer the article in a desired orientation to a load port.

In view of this, it is an object of an aspect of the present invention to provide an overhead transport vehicle and an overhead transport system that can transfer an article in a desired orientation to a load port.

Solution to Problem

An overhead transport vehicle according to an aspect of the present invention includes: an article holding unit configured to hold an article; a linear drive unit configured to drive the article holding unit to move linearly; a pivoting drive unit configured to drive the article holding unit to pivot horizontally; and a control unit configured to control the pivoting drive unit in accordance with orientation of the article held by the article holding unit and orientation of a load port on which the article is placed.

With this overhead transport vehicle, regardless of the orientation of an article held by the article holding unit, the control unit controls the pivoting drive unit in accordance with the orientation of the article and the orientation of the load port, thereby being able to transfer the article in a desired orientation to the load port.

In the overhead transport vehicle according to an aspect of the present invention, the linear drive unit may include a lifting drive unit configured to raise and lower the article holding unit and a slide drive unit configured to slide and move the lifting drive unit, and the pivoting drive unit may include a first pivoting drive unit configured to horizontally pivot the slide drive unit and a second pivoting drive unit configured to horizontally pivot the article holding unit or the lifting drive unit. By this configuration, the orientation of an article can be specifically controlled.

The overhead transport vehicle according to an aspect of the present invention may be an overhead transport vehicle capable of traveling along a rail arranged at least partially in a grid pattern, and may include: a traveling wheel configured to roll on the rail; and a body section disposed below the rail and including the article holding unit, the linear drive unit, and the pivoting drive unit. By this configuration, traveling paths for the overhead transport vehicle can be selected easily and flexibly, whereby traffic congestion can be prevented and conveyance efficiency can be improved.

In the overhead transport vehicle according to an aspect of the present invention, the control unit may perform: a first control of horizontally pivoting the article holding unit by a first angle such that the orientation of the article and the orientation of the load port are in a certain relation; and a second control of horizontally pivoting the article holding unit by a second angle smaller than the first angle such that the orientation of the article is fine-tuned. By these controls, the article can be reliably transferred in the desired orientation to the load port.

An overhead transport system according to an aspect of the present invention includes: a plurality of processing devices disposed so as to be aligned along a passage on each of one side and the other side of the passage; and the overhead transport vehicle described above. Each of the processing devices includes the load port disposed on a side of the processing device closer to the passage. The overhead transport system includes a traveling path, serving as a path along which the overhead transport vehicle travels, extending across the passage and allowing the overhead transport vehicle to pass through above a pair of the load ports.

Generally, because the orientations of a pair of load ports facing each other with a passage interposed therebetween are opposite to each other, it is difficult to transfer an article between the pair of load ports such that the orientation of the article and the orientation of each load port are in the certain relation. To solve this problem, the overhead transport system according to this aspect of the present invention includes the traveling path extending across the passage and allowing the overhead transport vehicle to pass through above the pair of load ports (hereinafter also referred to as cross-traveling path) and the overhead transport vehicle described above. Even between the pair of load ports at the cross-traveling path, an article can be transferred in a desired orientation by appropriately controlling the pivoting drive unit by the control unit.

Advantageous Effects of Invention

According to an aspect of the present invention, it is possible to provide the overhead transport vehicle and the overhead transport system that can transfer an article in a desired orientation to a load port.

DESCRIPTION OF EMBODIMENTS

Figure 1:
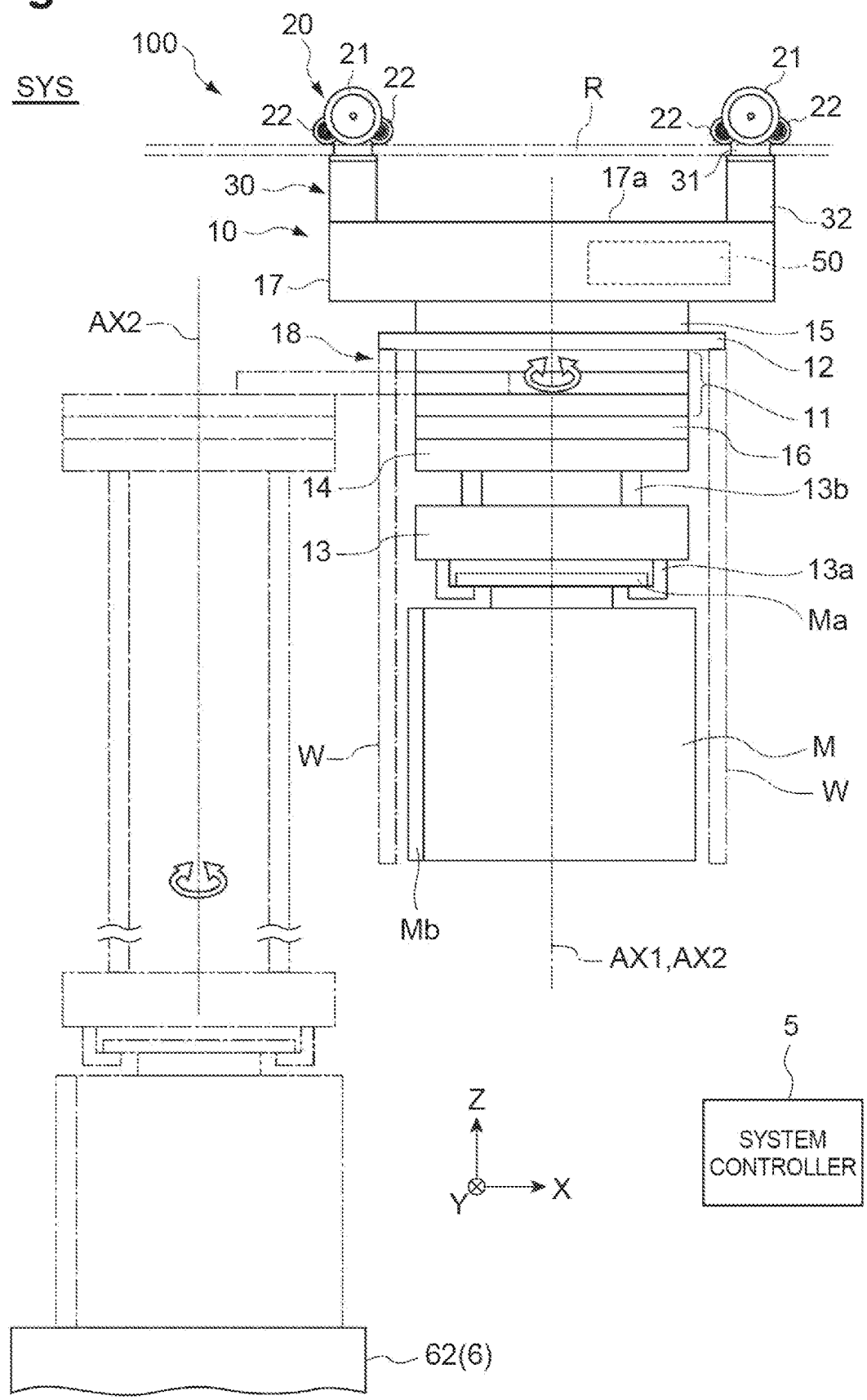
FIG. 1 is a side view illustrating an example of an overhead transport system according to an embodiment.

An embodiment will now be described with reference to the drawings. In the drawings, in order to describe the embodiment, the scale is changed to be expressed appropriately by, for example, illustrating a part in an enlarged or emphasized manner. In each drawing, directions in the drawing are illustrated with the XYZ-coordinate system. In this XYZ-coordinate system, a plane parallel to the horizontal plane is defined as an XY plane. A linear direction along the XY plane is denoted as the X direction, and a direction orthogonal to the X direction is denoted as the Y direction. A direction in which an overhead transport vehicle 100 travels can be changed from a state illustrated in the drawing to other directions and, for example, it may travel in a curved direction. The direction perpendicular to the XY plane is denoted as the Z direction. Each of the X direction, the Y direction, and the Z direction is described on the assumption that the direction indicated by the arrow in the drawing is the +direction and the opposite direction is the −direction. The direction of rotation about the Z axis is denoted as θZ direction.

Figure 2:
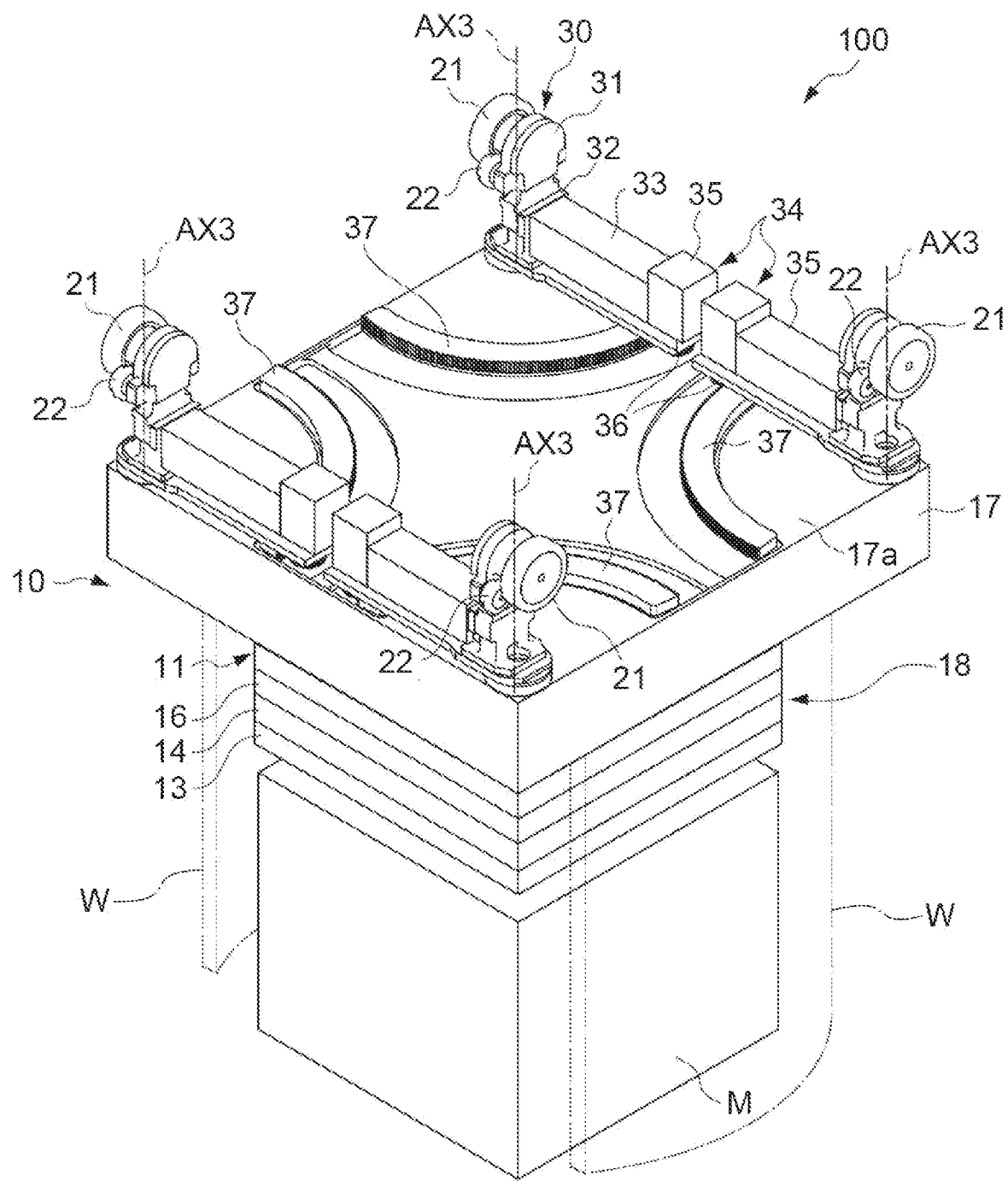
FIG. 2 is a perspective view illustrating an overhead transport vehicle in FIG. 1.
Figure 3:
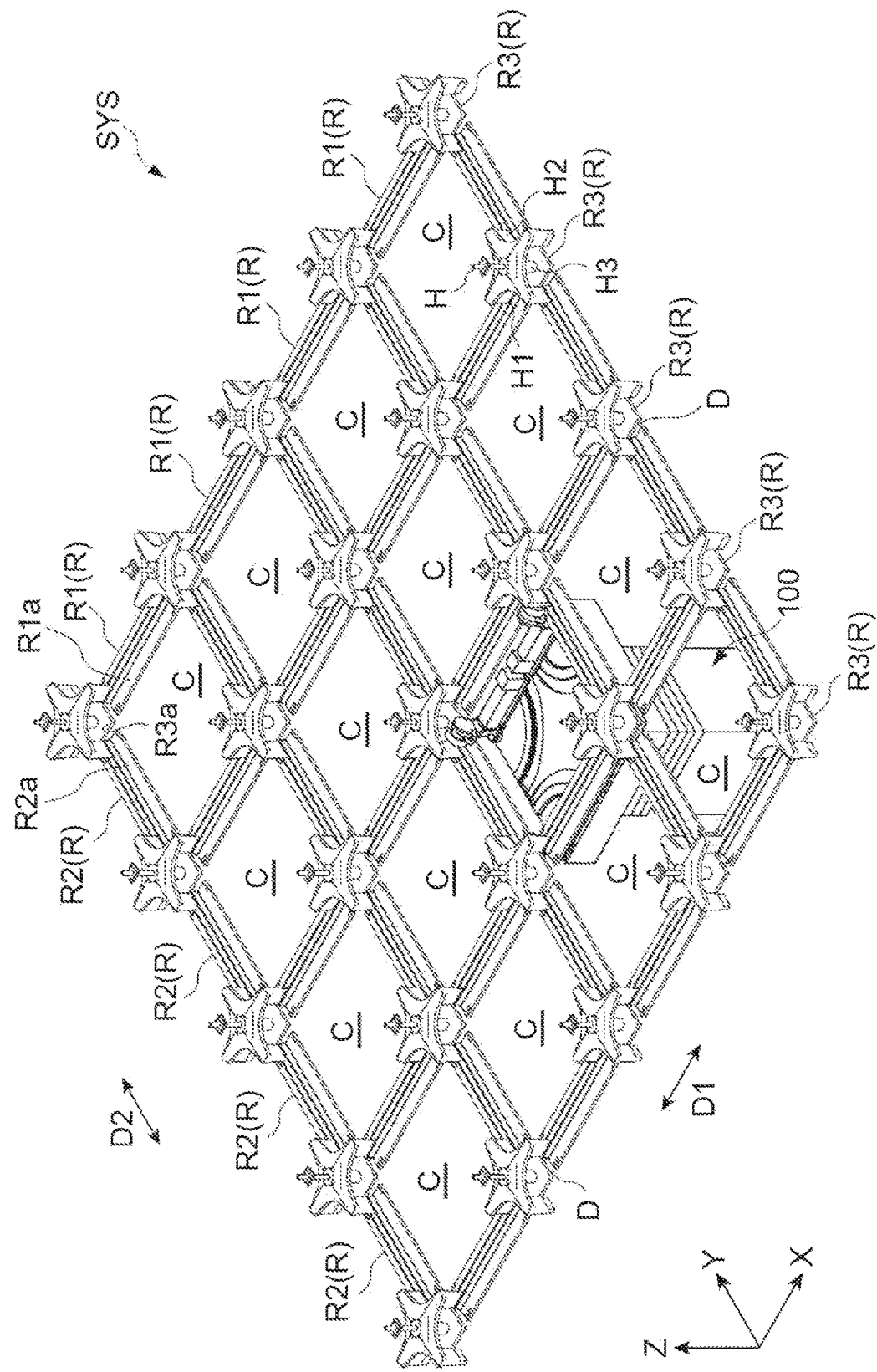
FIG. 3 is a perspective view illustrating the overhead transport system in FIG. 1.

As illustrated in FIG. 1, FIG. 2, and FIG. 3, an overhead transport system SYS is a system for conveying articles M by the overhead transport vehicle 100 in a clean room of a semiconductor manufacturing factory, for example. The overhead transport system SYS includes the overhead transport vehicle 100 and a system controller 5 to convey articles M to a plurality of processing devices 6. Examples of the articles M include a FOUP configured to accommodate semiconductor wafers or a reticle pod configured to accommodate reticles. Each article M has an orientation and, for example, a side opposite to a side of a lid Mb of the article M is the front orientation.

Figure 5:
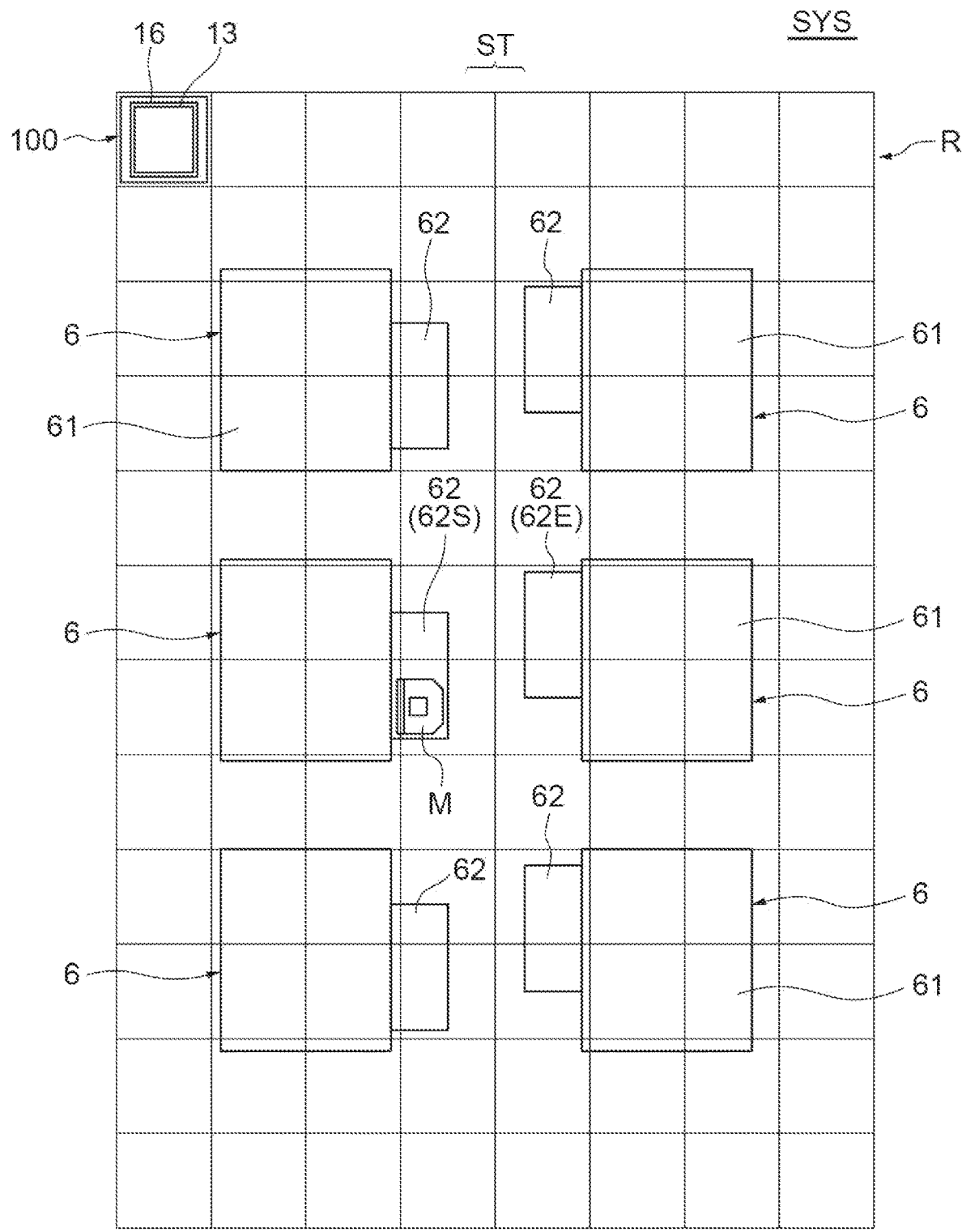
FIG. 5 is a plan view illustrating an example when an article is conveyed between load ports by the overhead transport vehicle in the overhead transport system in FIG. 1.

Each processing device 6 is a device configured to perform processing on an article M. The processing device 6 is not limited to a particular one, and may be a device of various types. As illustrated in FIG. 5, the processing devices 6 are disposed so as to be aligned along a passage ST on each of one side and the other side of the passage ST. Each of the processing devices 6 includes a device body 61 and a load port 62. The load port 62 is disposed on a side closer to the passage ST, and an article M is placed thereon. The load port 62 has an orientation and, for example, a side of the load port 62 closer to the passage ST is defined as the front orientation thereof. The orientation of the load port 62 corresponds to the orientation of the article M to be placed thereon. For example, the article M is placed on the load port 62 such that the front of the load port 62 matches the front of the article M (such that the lid Mb of the article M faces the device body 61).

As illustrated in FIG. 1, FIG. 2, and FIG. 3, the overhead transport vehicle 100 moves along a rail R of the overhead transport system SYS to convey an article M. The overhead transport vehicle 100 may be referred to as an overhead traveling vehicle because it travels near a ceiling of a building. The overhead transport vehicle 100 may be used in plurality, for example. Conveying articles M by the overhead transport vehicles 100 enables high-density conveyance, which can improve the efficiency of conveying articles M.

The rail R is installed on a ceiling of a building such as a clean room or near the ceiling. The rail R is a grid-patterned rail including first rails R1, second rails R2, and intersection rails R3 (see FIG. 3). The rail R is arranged at least partially in a grid pattern. Hereafter, the rail R is referred to as the grid-patterned rail R. The first rails R1 are provided along the X direction (first direction D1). The second rails R2 are provided along the Y direction (second direction D2). In the present embodiment, the first direction D1 and the second direction D2 are orthogonal to each other, and the first rails R1 and the second rails R2 are provided along directions orthogonal to each other, but are provided so as not to directly intersect each other. The intersection rails R3 are disposed at intersections of the first rails R1 and the second rails R2. In the grid-patterned rail R, the first rails R1 and the second rails R2 are provided along orthogonal directions, whereby a plurality of cells C (compartments) are adjacent to each other in plan view. In FIG. 3, part of the grid-patterned rail R is illustrated, and the same configuration of the grid-patterned rail R is formed continuously in the first direction D1 (X direction) and the second direction D2 (Y direction) from the illustrated configuration.

The first rails R1, the second rails R2, and the intersection rails R3 are suspended and supported on a ceiling (not illustrated) by suspending members H (see FIG. 3). Each suspending member H has first portions H1 for suspending first rails R1, second portions H2 for suspending second rails R2, and a third portion H3 for suspending an intersection rail R3. The first portions H1 and the second portions H2 are each formed at two locations with the third portion H3 interposed therebetween.

The first rails R1, the second rails R2, and the intersection rails R3 have traveling surfaces R1a, R2a, and R3a, respectively, on which traveling wheels 21 (described later) of the overhead transport vehicle 100 travel. A gap D is formed each between each first rail R1 and the corresponding intersection rail R3 and between each second rail R2 and the corresponding intersection rail R3. The gap D is a space through which a coupling section 30 described later, which is a part of an overhead transport vehicle 100, passes when the overhead transport vehicle 100 travels on a first rail R1 and crosses a second rail R2, or when it travels on a second rail R2 and crosses a first rail R1. Thus, the gap D is formed in a width through which the coupling section 30 can pass. The first rails R1, the second rails R2, and the intersection rails R3 are provided along the same or substantially the same horizontal plane. In the present embodiment, the traveling surfaces R1a, R2a, R3a of the first rails R1, the second rails R2, and the intersection rails R3 are arranged on the same or substantially the same horizontal plane.

As illustrated in FIG. 1 and FIG. 2, each overhead transport vehicle 100 is a carrier capable of traveling along the rail R, and includes a body section 10, a traveling unit 20, the coupling section 30, and a vehicle controller (control unit) 50.

The body section 10 is disposed below (on the −Z side) the grid-patterned rail R. The body section 10 is formed in a rectangular shape, for example, in plan view. The body section 10 is formed to have dimensions that fit into one cell C in the rail R in plan view. This allows the overhead transport vehicle 100 to pass another one traveling on the adjacent first rail R1 or the adjacent second rail R2.

The body section 10 includes an upper unit 17 and a transfer device 18. The upper unit 17 is suspended and supported by the traveling unit 20 with the coupling section 30 interposed therebetween. The upper unit 17 is rectangular in plan view, for example, and has four corners on an upper surface 17a thereof. On each of the four corners of the body section 10, a traveling wheel 21, the coupling section 30, and a direction-changing mechanism 34 are provided.

The transfer device 18 is provided below the upper unit 17. The transfer device 18 can rotate about a first vertical axis AX1 in the vertical direction. The transfer device 18 includes an article holding unit 13 configured to hold an article M, a lifting drive unit 14 configured to raise and lower the article holding unit 13 in the vertical direction, a slide drive unit 11 configured to slide and move the lifting drive unit 14 in a horizontal direction, a turning unit 12 configured to hold the slide drive unit 11, a first pivoting drive unit 15 configured to horizontally pivot (rotationally drive) the slide drive unit 11 about the first vertical axis AX1 with respect to the body section 10, and a second pivoting drive unit 16 configured to horizontally pivot the lifting drive unit 14 about a second vertical axis AX2 with respect to the slide drive unit 11. The lifting drive unit 14 and the slide drive unit 11 constitute a linear drive unit configured to drive the article holding unit 13 to move linearly. The first pivoting drive unit 15 and the second pivoting drive unit 16 constitute a pivoting drive unit configured to drive the article holding unit 13 to horizontally pivot. Horizontally pivoting means pivoting about an axis along the vertical direction as the axis of rotation.

The slide drive unit 11 includes a plurality of movable plates disposed in a manner stacked in the Z direction, for example. The movable plates are movable in the Y direction. To the lowermost movable plate, the second pivoting drive unit 16 is attached. The slide drive unit 11 can move the movable plates by a driving device (not illustrated), and slide and move the lifting drive unit 14 and the article holding unit 13 attached to the lowermost movable plate so as to protrude in one direction with respect to the traveling direction, that is, in one direction of linear directions. The turning unit 12 is attached to the first pivoting drive unit 15 between the slide drive unit 11 and the upper unit 17, and holds the slide drive unit 11.

The article holding unit 13 grips a flange Ma of an article M, thereby suspending and holding the article M. The article holding unit 13 is, for example, a chuck including claws 13a that can move horizontally. By causing the claws 13a to proceed to below the flange Ma of the article M and raising the article holding unit 13, the article M is held. The article holding unit 13 is connected to suspending members 13b such as wires or belts.

The lifting drive unit 14 is attached to the second pivoting drive unit 16. The lifting drive unit 14 is a hoist, for example, which lowers the article holding unit 13 by paying out the suspending members 13b, and raises the article holding unit 13 by winding the suspending members 13b. The lifting drive unit 14 is controlled by the vehicle controller 50 to lower or raise the article holding unit 13 at a predetermined speed. The lifting drive unit 14 is controlled by the vehicle controller 50 to hold the article holding unit 13 at a target height.

The first pivoting drive unit 15, for which an electric motor or the like is used, rotates the turning unit 12 about the first vertical axis AX1. The first pivoting drive unit 15 can rotate the turning unit 12 and also rotate the slide drive unit 11 about the first vertical axis AX1. When the slide drive unit 11 is rotated about the first vertical axis AX1 by the first pivoting drive unit 15, the second pivoting drive unit 16, the lifting drive unit 14, and the article holding unit 13 that are attached to the lower side of the slide drive unit 11 are rotated together about the first vertical axis AX1. The second pivoting drive unit 16, for which an electric motor or the like is used, rotates the lifting drive unit 14 about the second vertical axis AX2.

Figure 4:
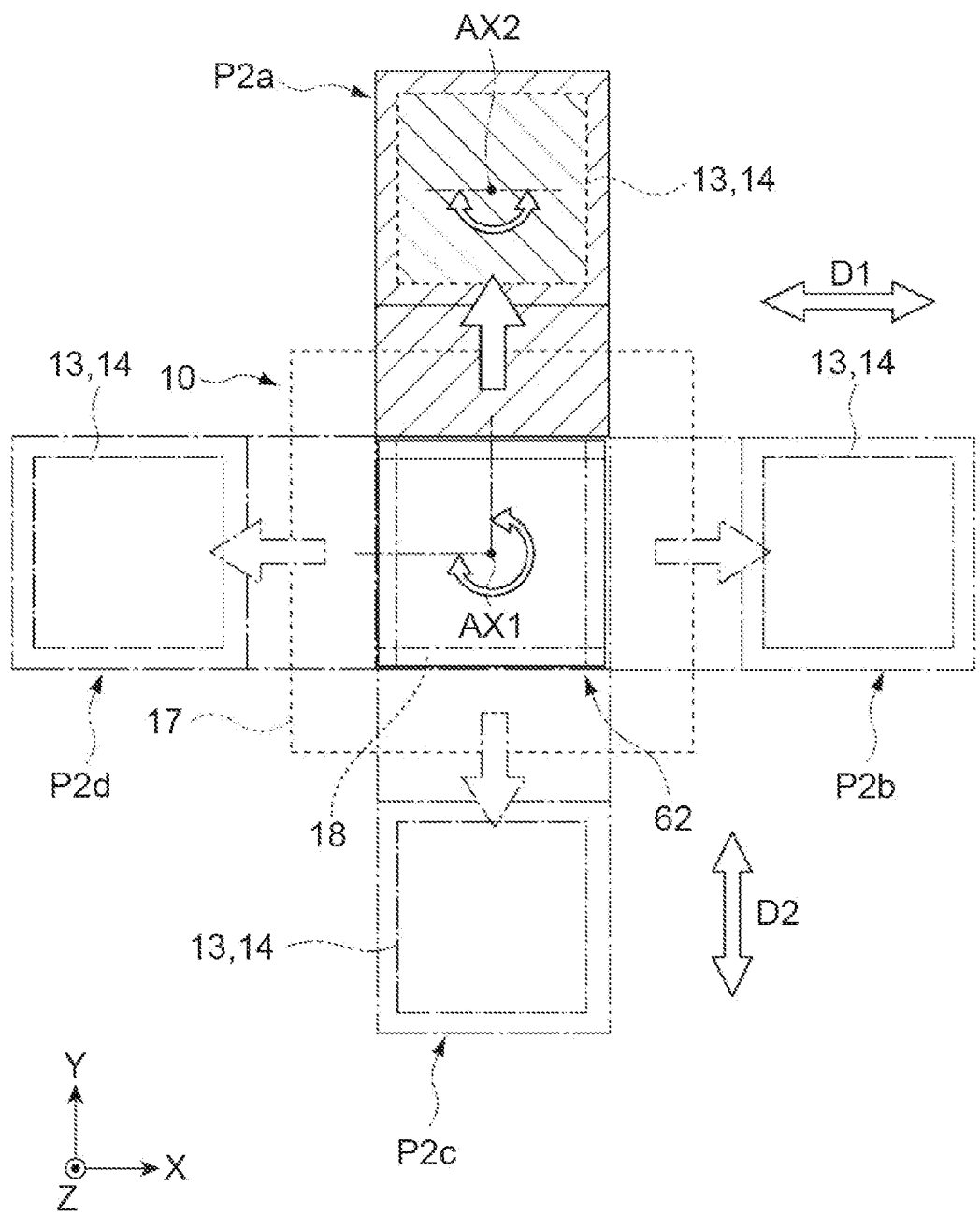
FIG. 4 is a diagram schematically illustrating the overhead transport vehicle in FIG. 1 when viewed from above.

FIG. 4 is a diagram schematically illustrating the body section 10 when viewed from above. FIG. 4 illustrates an example of the rotational movement of the slide drive unit 11 and the lifting drive unit 14. As illustrated in FIG. 4, the first pivoting drive unit 15 can rotate the slide drive unit 11 within a range of 270 degrees about the first vertical axis AX1 from a state in which the direction of sliding movement of the slide drive unit 11 is aligned in the first direction D1 or the second direction D2. In this case, the article holding unit 13 can be slid and moved from the body section 10 stopped on the grid-patterned rail R to either direction of the first direction D1 and the second direction D2. Furthermore, the article M can be placed in a desired orientation onto the load port 62.

The transfer device 18 can protrude the lifting drive unit 14 and the article holding unit 13 from a transfer position P1 to any of protruding positions P2a, P2b, P2c, P2d by driving the slide drive unit 11. The protruding position P2a is a protruding position when the lifting drive unit 14 and the article holding unit 13 have been slid and moved in the +Y direction by the slide drive unit 11. The protruding position P2b is a protruding position when the slide drive unit 11 has been rotated 90 degrees (e.g., 90 degrees clockwise) about the first vertical axis AX1 by the first pivoting drive unit 15 and then the lifting drive unit 14 and the article holding unit 13 have been slid and moved in the +X direction by the slide drive unit 11. The protruding position P2c is a protruding position when the slide drive unit 11 has been rotated 180 degrees about the first vertical axis AX1 by the first pivoting drive unit 15 and then the lifting drive unit 14 and the article holding unit 13 have been slid and moved in the −Y direction by the slide drive unit 11. The protruding position P2d is a protruding position when the slide drive unit 11 has been rotated 270 degrees about the first vertical axis AX1 by the first v15 and then the lifting drive unit 14 and the article holding unit 13 have been slid and moved in the −X direction by the slide drive unit 11.

As described above, the slide drive unit 11 is configured to slide and move the lifting drive unit 14 and the article holding unit 13 in one direction of the linear directions. However, by driving the first pivoting drive unit 15 to set the turning position of the slide drive unit 11 at intervals of 90 degrees, the lifting drive unit 14 and the article holding unit 13 can be slid and moved in each of four directions of the +X direction (first direction D1), the +Y direction (second direction D2), the −X direction (first direction D1), and −Y direction (second direction D2).

The second pivoting drive unit 16, for which an electric motor or the like is used, rotates the lifting drive unit 14 (the article holding unit 13) within a range of at least 180 degrees about the second vertical axis AX2 with respect to the linear direction of sliding movement by the slide drive unit 11. In FIG. 4, the lifting drive unit 14 (the article holding unit 13) can be rotated 180 degrees about the second vertical axis AX2 within a range of the direction indicated by a dash-dotted line passing through the second vertical axis AX2 (direction orthogonal to the linear direction). In this case, the article M can be placed in the desired orientation onto the load port 62. For example, by driving the second pivoting drive unit 16 to rotate the front side of the article M 180 degrees about the second vertical axis AX2 from a state of being oriented toward the +X direction, the front side of the article M can be oriented toward the −X direction (i.e., the opposite direction). For example, by driving the second pivoting drive unit 16, the front side of the article M can be set from a state of being oriented toward the +X direction into a state of being oriented toward the +Y direction or the −Y direction.

As illustrated in FIG. 1, FIG. 2, and FIG. 3, the traveling unit 20 includes the traveling wheels 21 and the auxiliary wheels 22. The traveling wheels 21 are disposed at the respective four corners of the upper surface 17a of the upper unit 17 (the body section 10). Each traveling wheel 21 is attached to an axle (not illustrated) provided to the corresponding coupling section 30. The axles are provided parallel or substantially parallel along the XY plane. Each traveling wheel 21 is rotationally driven by the driving force of a traveling drive unit 33 described later. Each traveling wheel 21 rolls on the grid-patterned rail R. The respective traveling wheels 21 roll on the traveling surfaces R1a, R2a, R3a of the first rails R1, the second rails R2, and the intersection rails R3 in the grid-patterned rail R, thereby causing the overhead transport vehicle 100 to travel. Herein, all of the four traveling wheels 21 do not necessarily have to be rotationally driven by the driving force of the traveling drive unit 33, and some of the four traveling wheels 21 may be configured to be rotationally driven.

Each traveling wheel 21 is provided to be able to pivot in the θZ direction about a pivot axis AX3. The traveling wheel 21 pivots in the θZ direction by the corresponding direction-changing mechanism 34 described later, and consequently can change the traveling direction of the overhead transport vehicle 100. The auxiliary wheels 22 are disposed each in front of and rear of the traveling wheel 21 in the traveling direction. Each of the auxiliary wheels 22 can rotate in the θZ direction in the same manner as the traveling wheel 21. The lower ends of the auxiliary wheels 22 are set higher than the lower end of the traveling wheel 21. Thus, when the traveling wheel 21 is traveling on the traveling surfaces R1a, R2a, R3a, the auxiliary wheels 22 do not come into contact with the traveling surfaces R1a, R2a, R3a. When the traveling wheel 21 passes over a gap D (see FIG. 3), the auxiliary wheels 22 come into contact with the traveling surfaces R1a, R2a, R3a to prevent the traveling wheel 21 from falling. Herein, two auxiliary wheels 22 do not necessarily have to be provided to one traveling wheel 21. For example, one auxiliary wheel 22 may be provided on one traveling wheel 21, or no auxiliary wheel 22 may be provided.

As illustrated in FIG. 1 and FIG. 2, a cover W may be provided to surround the transfer device 18 and the article M held by the transfer device 18. The cover W has a shape that is open at the lower end thereof, and has such a shape that a portion thereof through which the movable plates of the slide drive unit 11 protrude (portion through which they slide and move) is recessed. The cover W, the upper end of which is attached to the turning unit 12, turns about the first vertical axis AX1 as the turning unit 12 turns.

The coupling sections 30 couple the upper unit 17 of the body section 10 to the traveling units 20. The coupling sections 30 are provided at the respective four corners of the upper surface 17a of the upper unit 17 (the body section 10). By these coupling sections 30, the body section 10 is suspended and disposed below the grid-patterned rail R. Each coupling section 30 includes a support member 31 and a connecting member 32. The support member 31 rotatably supports the rotating shaft of the corresponding traveling wheel 21 and the rotating shafts of the corresponding auxiliary wheels 22. The support member 31 maintains the relative position between the traveling wheel 21 and the auxiliary wheels 22. The support member 31 is formed in a plate-like shape, for example, and is formed to have a thickness capable of passing through each gap D.

The connecting member 32 extends downward from the support member 31 and is coupled to the upper surface 17a of the upper unit 17 to hold the upper unit 17. The connecting member 32 includes inside a transmission mechanism configured to transmit the driving force of the traveling drive unit 33 described later to the traveling wheel 21. This transmission mechanism may have a configuration using a chain or a belt, or may have a configuration using a gear train. The connecting member 32 is provided to be rotatable in the θZ direction about the pivot axis AX3. This connecting member 32 rotates about the pivot axis AX3, thereby being able to pivot the traveling wheel 21 in the θZ direction.

Each coupling section 30 is provided with the traveling drive unit 33 and the direction-changing mechanism 34. The traveling drive unit 33 is mounted on the corresponding connecting member 32. The traveling drive unit 33 is a driving source configured to drive the traveling wheel 21 and, for example, an electric motor is used therefor. Each of the four traveling wheels 21 is driven by the corresponding traveling drive unit 33 to serve as a driving wheel. The four traveling wheels 21 are controlled by the vehicle controller 50 to have the same or substantially the same rotation speed. If any of the four traveling wheels 21 is not used as a driving wheel, the traveling drive unit 33 is not mounted on the corresponding connecting member 32.

The direction-changing mechanism 34 pivots the traveling wheel 21 in the direction θZ by pivoting the connecting member 32 of the coupling section 30 about the pivot axis AX3 with respect to the body section 10. By pivoting the traveling wheel 21 in the θZ direction, the overhead transport vehicle 100 can switch from a first state in which the traveling direction thereof is the first direction D1 to a second state in which the traveling direction is the second direction D2, or from the second state in which the traveling direction is the second direction D2 to the first state in which the traveling direction is the first direction D1.

The direction-changing mechanism 34 includes a driving source 35, a pinion gear 36, and a rack 37. The driving source 35 is attached on a side surface of the traveling drive unit 33 away from the pivot axis AX3. For the driving source 35, for example, an electric motor is used. The pinion gear 36 is attached to a lower side of the driving source 35, and is rotationally driven in the θZ direction by driving force generated by the driving source 35. The pinion gear 36 is circular in plan view and has a plurality of teeth in the circumferential direction of its outer circumference. The rack 37 is fixed to the upper surface 17a of the upper unit 17. The rack 37 is provided at each of the four corners of the upper surface 17a of the upper unit 17, and is formed in an arc shape centered around the pivot axis AX3 of the corresponding traveling wheel 21. The rack 37 has a plurality of teeth, which mesh with the teeth of the pinion gear 36, in the circumferential direction of its outer circumference.

The pinion gear 36 and the rack 37 are disposed with their teeth meshing with each other. When the pinion gear 36 rotates in the θZ direction, the pinion gear 36 accordingly moves in the circumferential direction centered around the pivot axis AX3 along the outer circumference of the rack 37. By this movement of the pinion gear 36, the connecting member 32 is pivoted, and the traveling drive unit 33 and the direction-changing mechanism 34 are pivoted in the circumferential direction centered around the pivot axis AX3 together with the pinion gear 36.

By this pivoting of the direction-changing mechanism 34, each of the traveling wheels 21 and the auxiliary wheels 22 disposed at the four corners of the upper surface 17a is pivoted within a range of 90 degrees in the θZ direction about the pivot axis AX3. The driving of the direction-changing mechanism 34 is controlled by the vehicle controller 50. The vehicle controller 50 may give an instruction to pivot the four traveling wheels 21 at the same timing, or may give an instruction to pivot them at different timings. By pivoting the traveling wheels 21 and the auxiliary wheels 22, the traveling wheels 21 shift from a state of being in contact with one of the first rails R1 and the second rails R2 to a state of being in contact with the other. This allows the overhead transport vehicle 100 to switch between the first state in which the traveling direction thereof is the first direction D1 (X direction) and the second state in which the traveling direction is the second direction D2 (Y direction).

The vehicle controller 50 is a computer including a central processing unit (CPU), a read only memory (ROM), and a random access memory (RAM). The vehicle controller 50 can be configured, for example, as software such that a program stored in the ROM is loaded into the RAM to be executed by the CPU. The vehicle controller 50 may be configured as hardware such as an electronic circuit. The vehicle controller 50 may be configured with a single device, or may be configured with a plurality of devices. If it is configured with a plurality of devices, they are connected via a communication network such as the Internet or an intranet to logically construct a single vehicle controller 50. The vehicle controller 50 is provided to the body section 10, but may be provided outside the body section 10.

The vehicle controller 50 collectively controls operations of the respective components of the overhead transport vehicle 100. The vehicle controller 50 controls traveling of the overhead transport vehicle 100 on the basis of conveyance instructions. The vehicle controller 50 controls the traveling of the overhead transport vehicle 100 by controlling the traveling drive unit 33 and the direction-changing mechanism 34, for example. The vehicle controller 50 controls transfer operation of the overhead transport vehicle 100 on the basis of conveyance instructions. The vehicle controller 50 controls the transfer operation of the overhead transport vehicle 100 by controlling the transfer device 18, for example. The vehicle controller 50 generates and updates status information (not illustrated) periodically. The vehicle controller 50 transmits the status information to the system controller 5. The status information is, for example, information on the current position of the overhead transport vehicle 100, information indicating the current status of the overhead transport vehicle 100 such as normal or abnormal, and information on the status (execution in progress, execution completed, or execution failed) of various instructions such as conveyance instructions executed by the overhead transport vehicle 100.

The system controller 5 is a computer including a CPU, a ROM, and a RAM. The system controller 5 can be configured, for example, as software such that a program stored in the ROM is loaded into the RAM to be executed by the CPU. The system controller 5 may be configured as hardware such as an electronic circuit. The system controller 5 may be configured with a single device or a plurality of devices. When it is configured with a plurality of devices, they are connected via a communication network such as the Internet or an intranet to logically construct a single system controller 5.

The system controller 5 generates a conveyance instruction. The system controller 5 selects any one of the overhead transport vehicles 100 that can convey an article M, and assigns the conveyance instruction to the selected overhead transport vehicle 100. The conveyance instruction includes a traveling instruction to perform traveling to a load port 62 at a conveyance source, an instruction to grab an article M placed on this load port 62, a traveling instruction to perform traveling to a load port 62 at a conveyance destination, and an instruction to unload the article M being held onto this load port 62. Information on the conveyance source and the conveyance destination can be received from a host controller (not illustrated), for example. A traveling path to be followed when traveling to the load port 62 at the conveyance source on the grid-patterned rail R can be acquired by various known methods. A traveling path to be followed when traveling to the load port 62 at the conveyance destination on the grid-patterned rail R can be likewise acquired by various known methods.

The system controller 5 stores load port information on the orientation of each of a plurality of the load ports 62 in advance. As an example, the system controller 5 stores load port information in which port numbers, locations, and orientations of the load ports 62 are associated with each other. The port numbers are identification numbers set for the respective load ports 62. The system controller 5 acquires the orientation of the load port 62 at the conveyance source and the orientation of the load port 62 at the conveyance destination in the conveyance instruction to be assigned, on the basis of the load port information. The system controller 5 transmits information on the orientation of the load port 62 at the conveyance source and the orientation of the load port 62 at the conveyance destination to the overhead transport vehicle 100 to which the conveyance instruction is to be assigned.

In the present embodiment herein, the vehicle controller 50 controls at least one of the first pivoting drive unit 15 and the second pivoting drive unit 16 in accordance with the orientation of the article M held by the article holding unit 13 and the orientation of the load port 62 on which the article M is placed with respect to a position where the overhead transport vehicle 100 stops. For example, because the orientation of the article M placed on the load port 62 is in a certain relation with (herein, the same as) the orientation of the load port 62, the orientation of the article M being held by the article holding unit 13 can be acquired based on the information on the orientation of the load port 62 at the conveyance source, which has been transmitted from the system controller 5. The orientation of the load port 62 on which the article M is placed can be acquired based on the information on the orientation of the load port 62 at the conveyance destination, which has been transmitted from the system controller 5.

The vehicle controller 50 performs: a first control of horizontally pivoting the article holding unit 13 by a first angle such that the orientation of the article M and the orientation of the load port 62 are in the certain relation; and a second control of horizontally pivoting the article holding unit 13 by a second angle such that the orientation of the article M is fine-tuned. The first angle is an angle of horizontal pivoting that is required because the orientation of the load port 62 at the conveyance source and the orientation of the load port 62 at the conveyance destination are different. The first angle is an angle of 90° or more and 270° or less, for example. The second angle is an angle of horizontal pivoting required to compensate for unintended misalignment in orientation of the article M. The second angle is smaller than the first angle, and is an angle of 10° or less, for example.

The following describes an example when an article M is conveyed between load ports 62 by the overhead transport vehicle 100 in the overhead transport system SYS.

In this example, as illustrated in FIG. 5, three processing devices 6 are disposed so as to be aligned along a passage ST on each of one side and the other side of the passage ST. The passage ST extends straight linearly when viewed from above. The processing devices 6 on one side of the passage ST and the processing devices 6 on the other side of the passage ST are disposed so as to face each other. The orientation of the load port 62 is an orientation that defines a side thereof closer to the passage ST as the front thereof. In this example herein, an article M placed on a load port 62S is transferred to a load port 62E that faces the load port 62S with the passage ST interposed therebetween. The orientation of the load port 62S and the orientation of the load port 62E are 180° opposite to each other.

The overhead transport vehicle 100 is assigned a conveyance instruction from the system controller 5 and receives, from the system controller 5, information on the respective orientations of the load ports 62S and 62E at a conveyance source and a conveyance destination based on the conveyance instruction. In response to this, the overhead transport vehicle 100 performs the following operations under the control of the vehicle controller 50.

Figure 6:
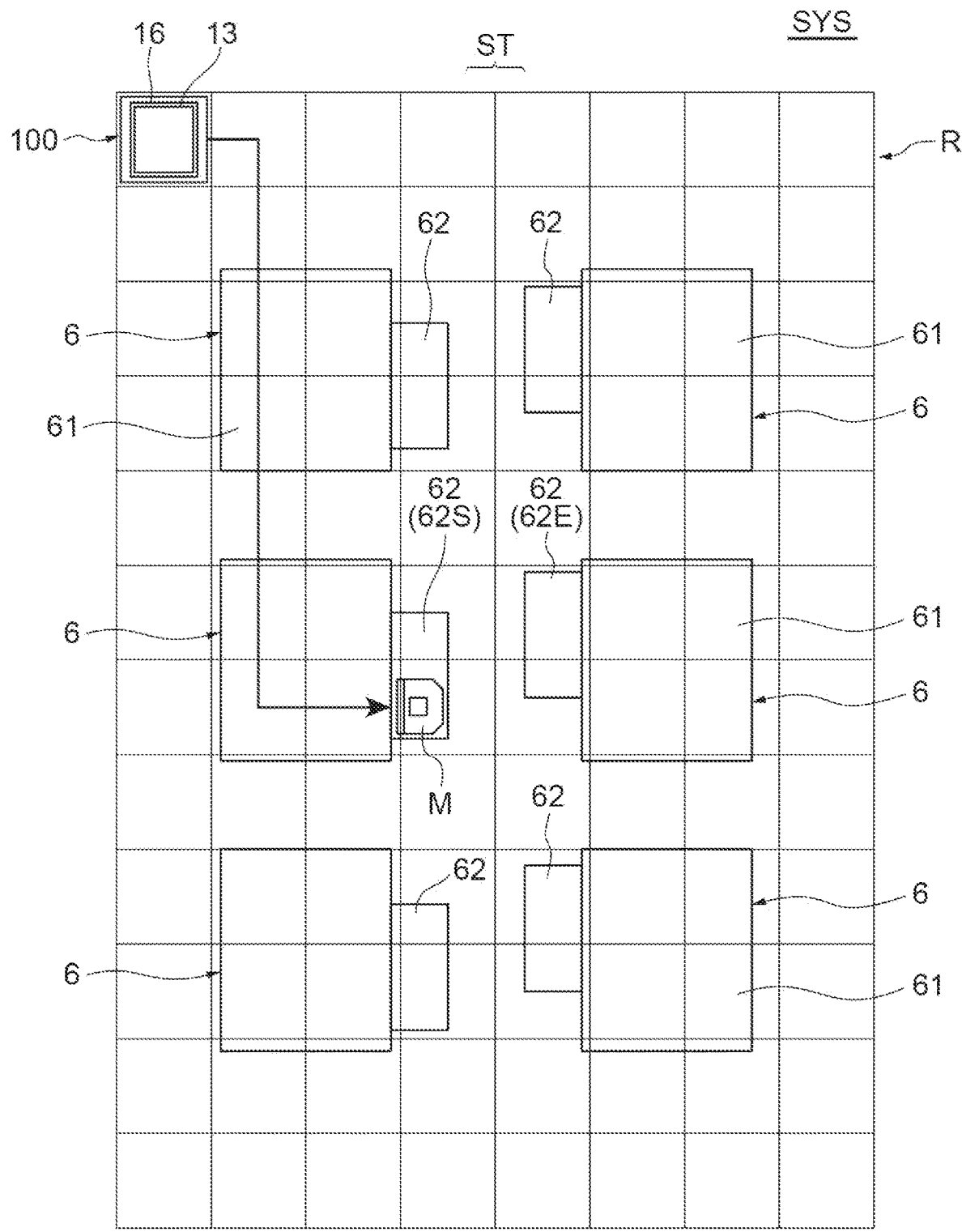
FIG. 6 is a plan view illustrating a continuation of FIG. 5.
Figure 7:
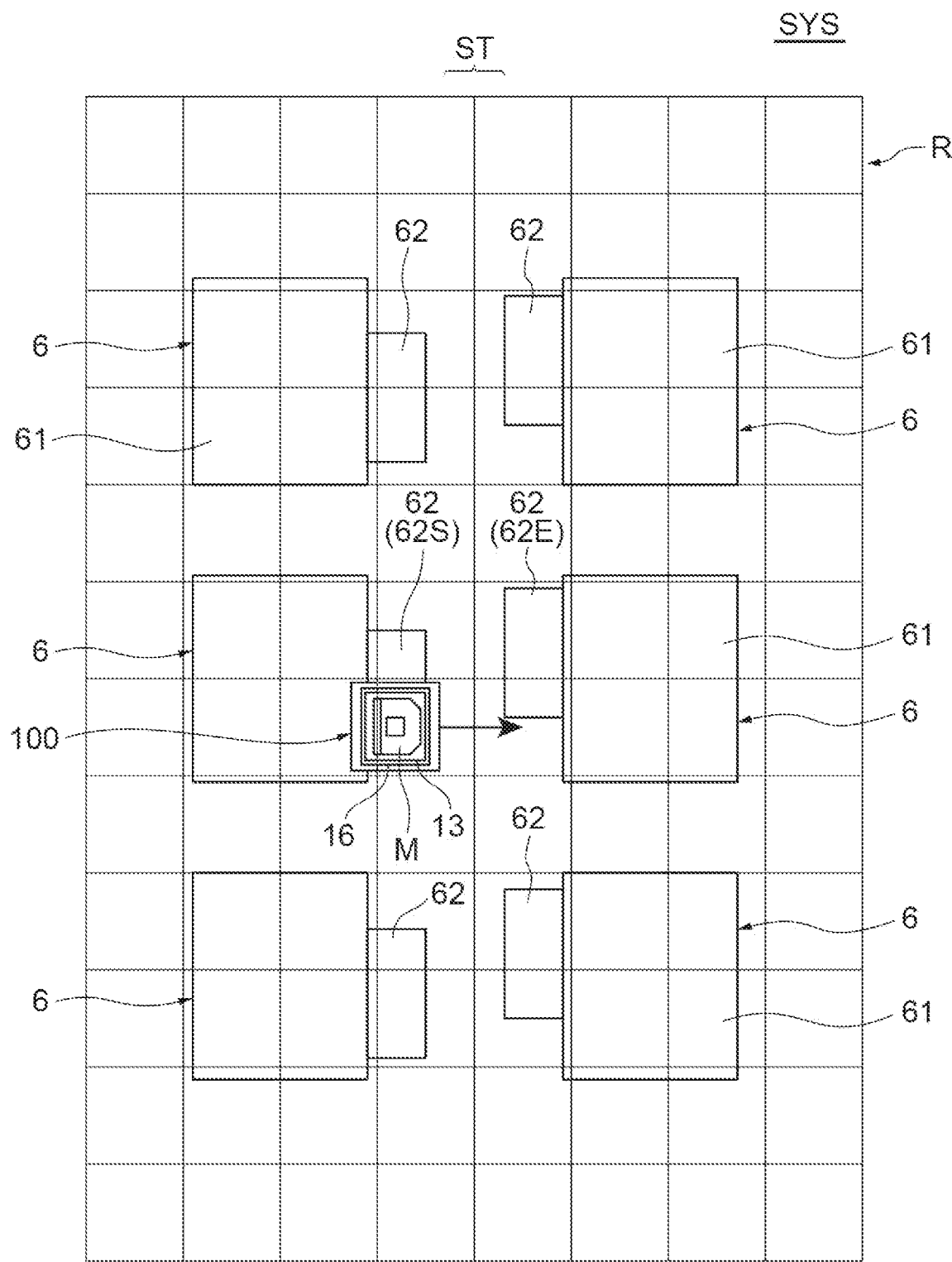
FIG. 7 is a plan view illustrating a continuation of FIG. 6.
Figure 8:
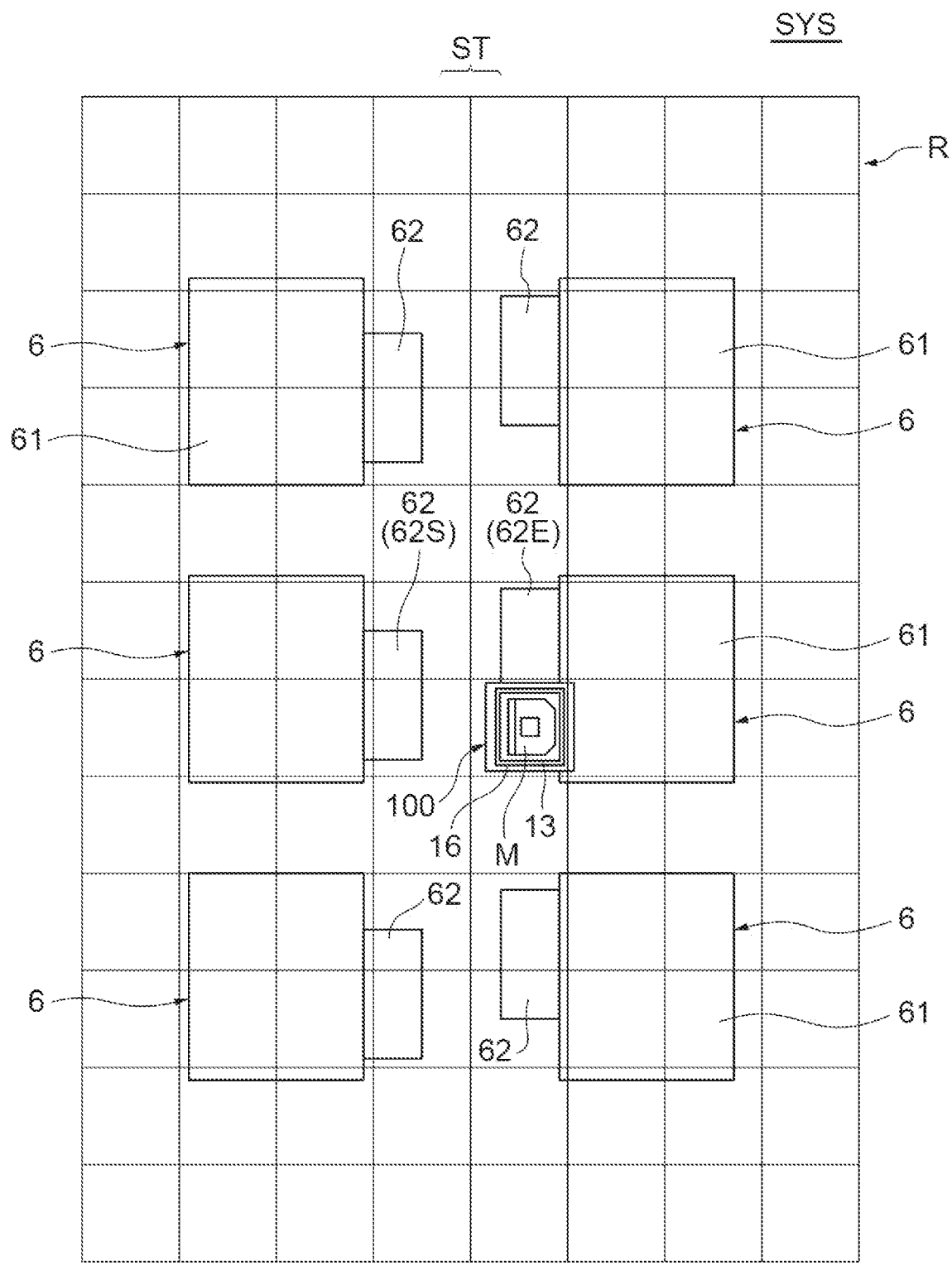
FIG. 8 is a plan view illustrating a continuation of FIG. 7.
Figure 9:
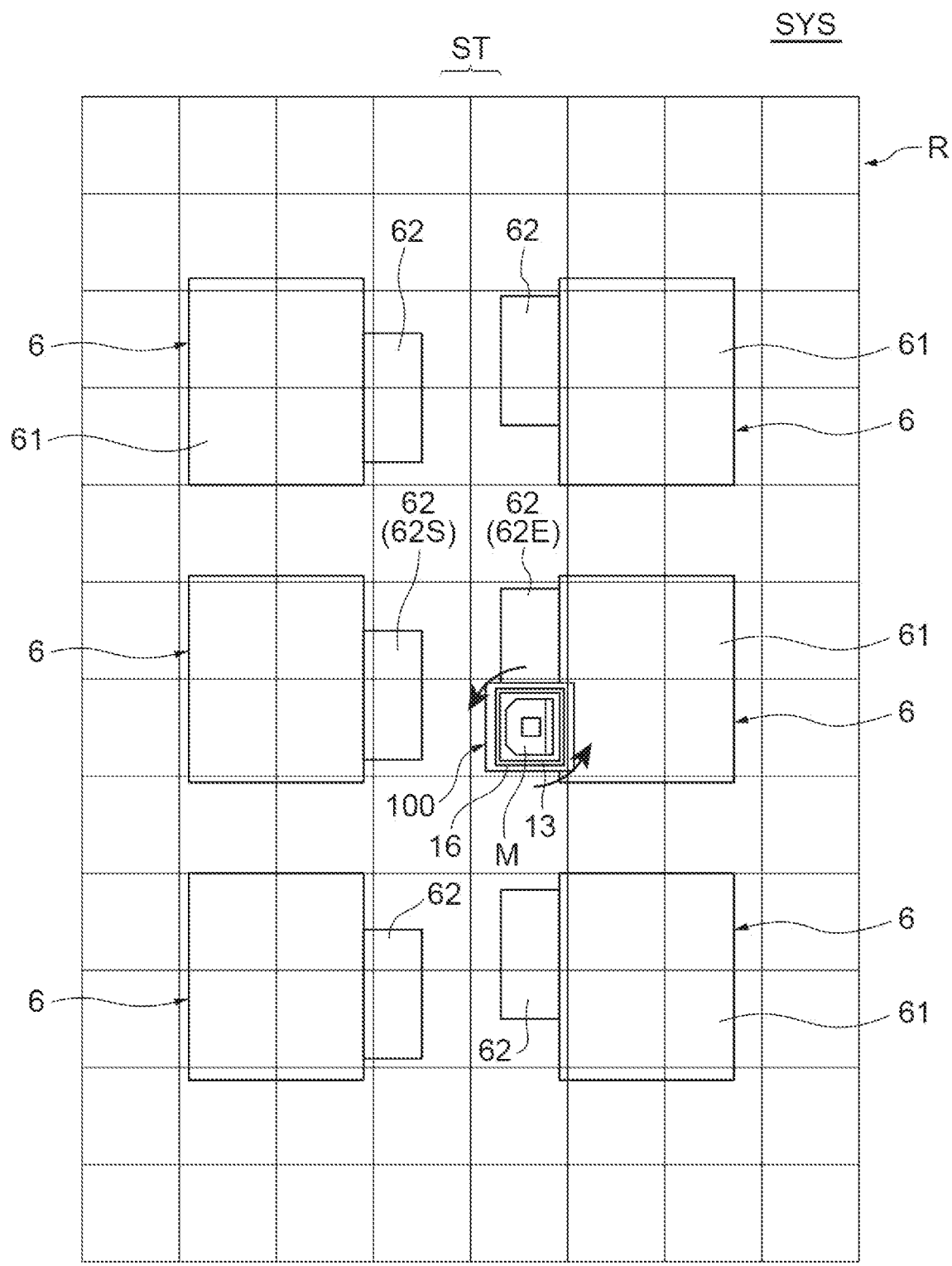
FIG. 9 is a plan view illustrating a continuation of FIG. 8.

More specifically, as illustrated in FIG. 6, the overhead transport vehicle 100 travels along a traveling path based on the conveyance instruction to a position where the article M can be transferred from the load port 62S at the conveyance source. As illustrated in FIG. 7, the overhead transport vehicle 100 grabs the article M placed on the load port 62S at the conveyance source. As illustrated in FIG. 8, the overhead transport vehicle 100 travels along the traveling path based on the conveyance instruction while grabbing the article M to a position where it can transfer the article M to the load port 62E at the conveyance destination. During conveyance to the load port 62E, as illustrated in FIG. 9, the first control is performed to control at least one of the first pivoting drive unit 15 and the second pivoting drive unit 16 such that the orientation of the article M matches the orientation of the load port 62E at the conveyance destination (such that the front of the article M is oriented toward the front of the load port 62E), and the article holding unit 13 is horizontally pivoted by the first angle. In the illustrated example, the first angle is 180°.

Figure 10:
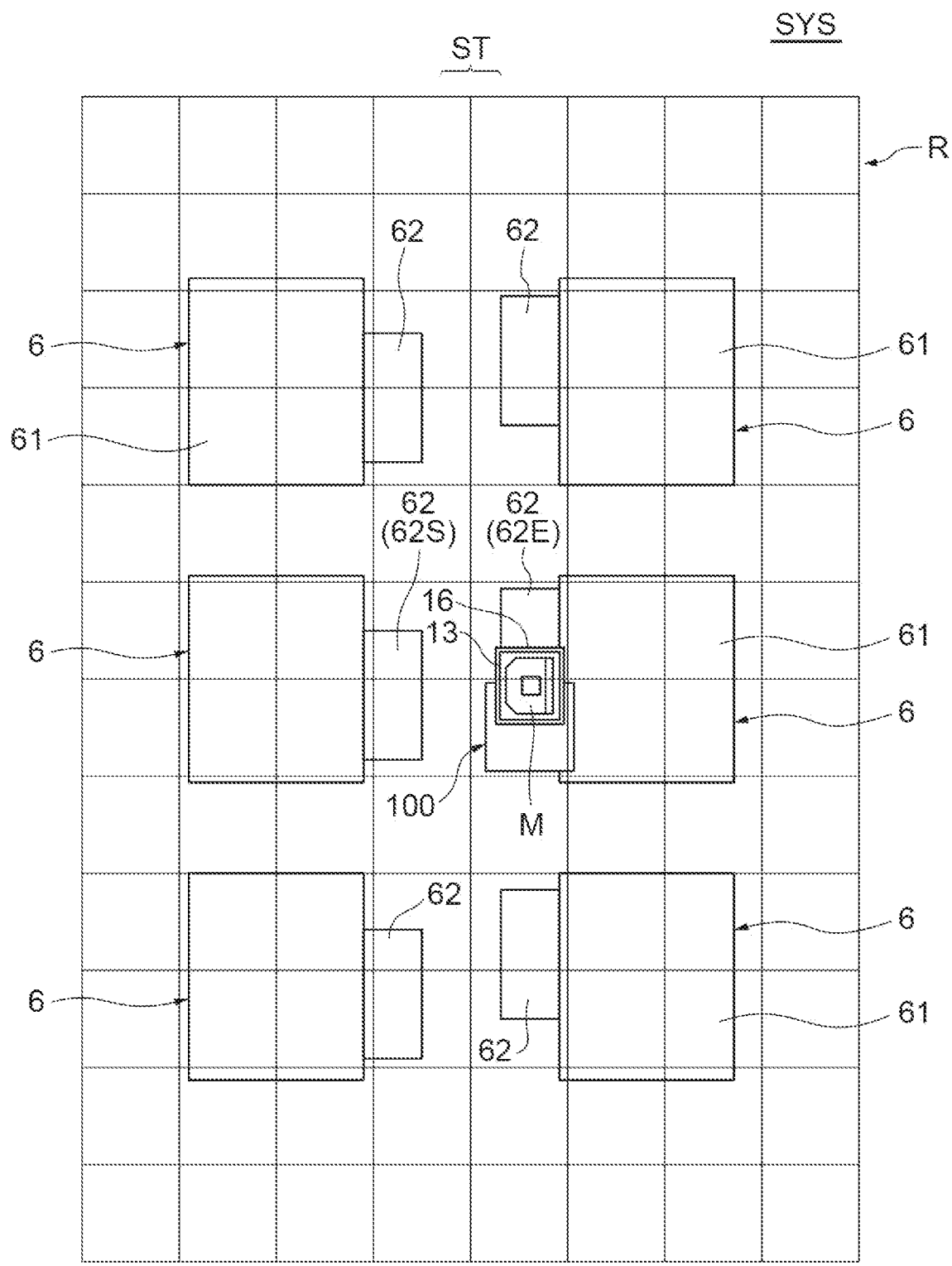
FIG. 10 is a plan view illustrating a continuation of FIG. 9.
Figure 11:
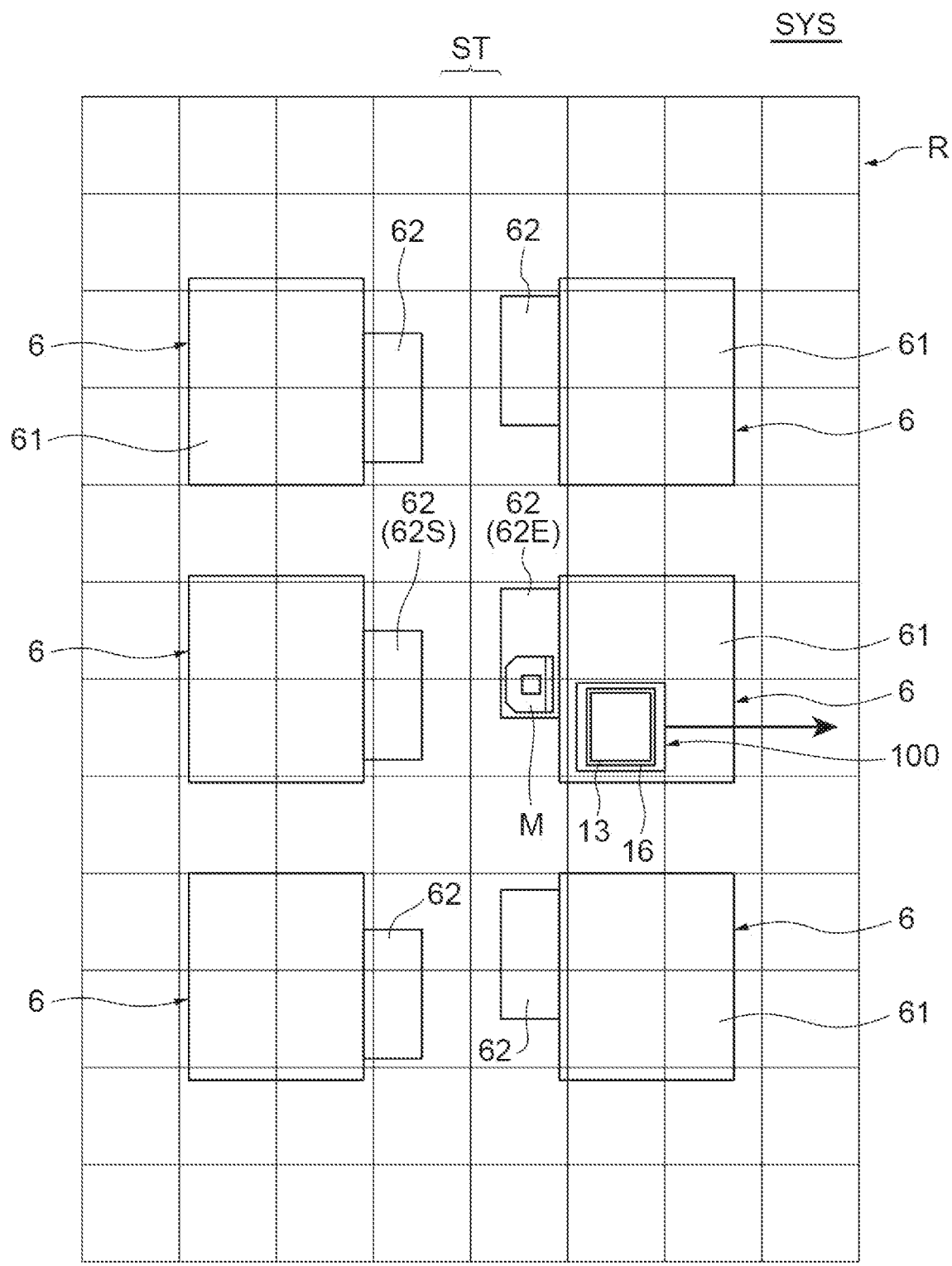
FIG. 11 is a plan view illustrating a continuation of FIG. 10.

As illustrated in FIG. 10, the overhead transport vehicle 100 unloads the article M onto the load port 62E at the conveyance destination. At this time, the second control is performed such that the orientation of the article M is fine-tuned (such that the front of the article M is properly oriented toward the front of the load port 62E), and at least one of the first pivoting drive unit 15 and the second pivoting drive unit 16 is controlled to horizontally pivot the article holding unit 13 by the second angle. By the processes described above, transfer of the article M from the load port 62S to the load port 62E is completed. The overhead transport vehicle 100 is then assigned with another conveyance instruction, for example, and travels toward another load port 62 (see FIG. 11).

As described above, with the overhead transport vehicle 100, regardless of the orientation of an article M held by the article holding unit 13, by controlling at least one of the first pivoting drive unit 15 and the second pivoting drive unit 16 in accordance with the orientation of the article M and a load port 62, the article M can be transferred in the desired orientation to the load port 62.

The overhead transport vehicle 100 includes, as linear drive units, the lifting drive unit 14 configured to raise and lower the article holding unit 13 and a slide drive unit 11 configured to slide the lifting drive unit 14, and also includes, as pivoting drive units, the first pivoting drive unit 15 configured to horizontally pivot the slide drive unit 11 and the second pivoting drive unit 16 configured to horizontally pivot the lifting drive unit 14. By this configuration, the orientation of an article M can be specifically controlled.

The overhead transport vehicle 100 is an overhead transport vehicle capable of traveling along the grid-patterned rail R, and includes the traveling wheels 21 configured to roll on the grid-patterned rail R and the body section 10 disposed below the grid-patterned rail R. By this configuration, traveling paths for the overhead transport vehicle 100 can be selected easily and flexibly, whereby traffic congestion can be prevented and conveyance efficiency can be improved.

In the overhead transport vehicle 100, the vehicle controller 50 performs: the first control of horizontally pivoting the article holding unit 13 by the first angle such that the orientation of the article M and the orientation of the load port 62 are in the certain relation; and the second control of horizontally pivoting the article holding unit 13 by the second angle such that the orientation of the article M is fine-tuned. By these controls, the article M can be reliably transferred in the desired orientation to the load port 62.

Although the embodiment has been described above, an aspect of the present invention is not limited to the embodiment, and various modifications may be made within the scope not departing from the gist of the invention.

In the above embodiment, the traveling path for the overhead transport vehicle 100 in the grid-patterned rail R is set by the system controller 5 on the basis of a conveyance instruction upon generation of the conveyance instruction. However, the present invention is not limited to this. For example, as illustrated in FIG. 12, the overhead transport system SYS may include, as a traveling path 7 along which the overhead transport vehicle 100 travels, cross-traveling paths 70 each extending across the passage ST and allowing the overhead transport vehicle 100 to pass through above a pair of load ports 62.

Figure 12:
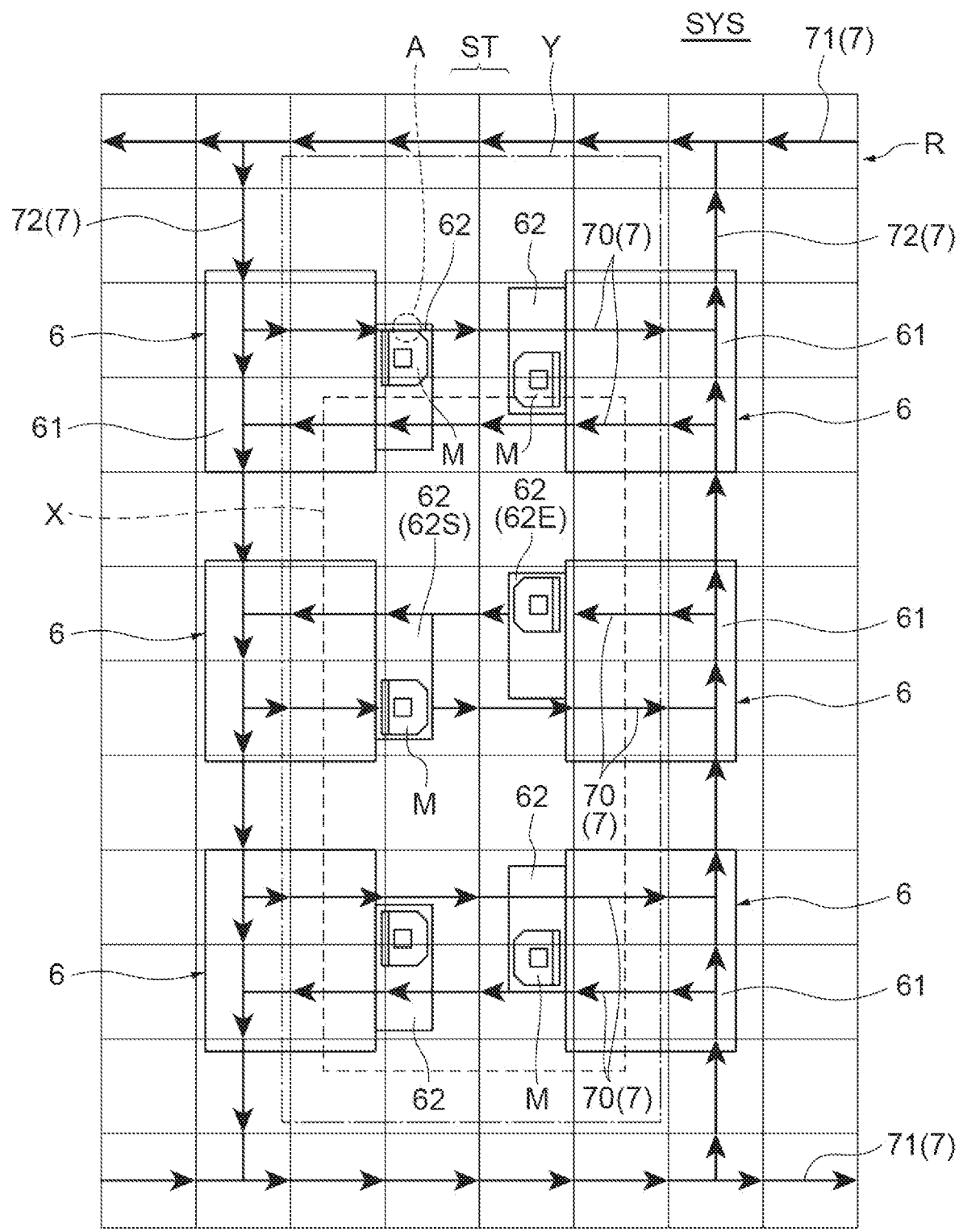
FIG. 12 is a plan view illustrating cross-traveling paths that an overhead transport system according to a modification includes.

In an example illustrated in FIG. 12, the traveling path 7 is a predetermined one-way path. The traveling path 7 includes at least first inter-bay paths 71 and second inter-bay paths 72 in addition to the cross-traveling paths 70. The first inter-bay paths 71 are set in a pair, which are aligned parallel and traveling directions of which are opposite to each other. The second inter-bay paths 72 are set in a pair, which are aligned parallel and traveling directions of which are opposite to each other. The second inter-bay paths 72 connect the pair of first inter-bay paths 71. The second inter-bay paths 72 extend in the direction along the passage ST. The cross-traveling paths 70 connect the pair of second inter-bay paths 72. The cross-traveling paths 70 constitute an intra-bay path. The cross-traveling paths 70 are set in pairs, which are aligned parallel and traveling directions of which are opposite to each other. Herein, three pairs of cross-traveling paths 70 are set between the pair of second inter-bay paths 72. The cross-traveling paths 70 are set to pass through above pairs of load ports 62 or their surroundings.

Generally, the orientations of a pair of load ports 62 facing each other with the passage ST interposed therebetween are opposite to each other. Thus, it is difficult to transfer an article M between the pair of load ports 62 such that the orientation of the article M and the orientation of each load port 62 are in the certain relation. To solve this problem, the overhead transport system SYS includes the cross-traveling paths 70 and the overhead transport vehicle 100. Even between a pair of load ports 62 at a cross-traveling path 70, an article M can be transferred in the desired orientation by appropriately controlling at least one of the first pivoting drive unit 15 and the second pivoting drive unit 16. Even if there is an overhead transport vehicle 100 performing transfer at the point A, traveling of an overhead transport vehicle 100 heading for each load port 62 to transfer an article M that is present in the area X will not be hindered because the article M in the area X is not present on the path passing through the point A. It is not necessary to provide a branching or merging point in the vicinity of load ports 62 (the area Y) available for transfer. Thus, congestion is less likely to occur near the load ports 62.

In the above embodiment, the overhead transport vehicle 100 acquires the orientation of an article M held in the article holding unit 13 on the basis of the information on the orientation of a load port 62 at a conveyance source, which has been transmitted from the system controller 5. However, the method of acquiring the orientation of the article M is not limited to a particular one. For example, an additional sensor or camera may be used to recognize the orientation of the article M held by the article holding unit 13. In the above embodiment, the overhead transport vehicle 100 acquires the orientation of a load port 62 at a conveyance destination on the basis of information on the orientation of the load port 62 at the conveyance destination, which has been transmitted from the system controller 5. However, the method of acquiring the orientation of the load port 62 at the conveyance destination is not limited to a particular one. For example, an additional sensor or camera may be used to recognize the orientation of the load port 62 at the conveyance destination.

In the above embodiment, the overhead transport vehicle 100 may be an overhead transport vehicle configured to travel along a rail that is not arranged in a grid pattern and carries one-way traffic. With such an overhead transport vehicle, to transfer an article M in a desired orientation to a load port 62, a direction in which it approaches to the load port 62 may be restricted, and thus a traveling path to the load port 62 may be restricted. In this case, there is concern that the traffic of another overhead transport vehicle 100 will be obstructed, resulting in traffic congestion and reduced conveyance efficiency. In contrast to this, by appropriately controlling the pivoting drive unit by the vehicle controller 50, the overhead transport vehicle 100 can deliver the article M in the desired orientation to the load port 62 regardless of the direction from which it has approached to the load port 62. Consequently, the overhead transport vehicle can prevent its traveling path to a target load port 62 from being restricted, and thus can easily select a traveling path that does not obstruct the traffic of another overhead transport vehicle, for example. Thus, traffic congestion can be prevented and conveyance efficiency can be improved. In the case of the overhead transport vehicle configured to travel along a rail that is not arranged in a grid pattern and carries one-way traffic, at least one of the first pivoting drive unit 15 and the second pivoting drive unit 16 is controlled in accordance with the direction of an article M held by the article holding unit 13, the orientation of a load port 62 at a conveyance destination, and the direction of approaching to a load port 62 at a conveyance destination.

In the above embodiment, the lifting drive unit 14 is configured to be horizontally pivoted by the second pivoting drive unit 16. However, the article holding unit 13 may be configured to be horizontally pivoted by the second pivoting drive unit 16. In the above embodiment, while the overhead transport vehicle 100 is traveling to a load port 62 at a conveyance destination, the first control of horizontally pivoting the article holding unit 13 is performed such that the orientation of an article M and the orientation of the load port 62 are in the certain relation. However, the timing of performing the first control is not limited to a particular one. For example, the first control may be performed while the article M is being unloaded onto a load port 62E at a conveyance destination.

The materials and shapes of the respective configurations in the embodiment and the modifications above are not limited to those described above, and various materials and shapes can be used. Each configuration in the embodiment or the modifications above may be optionally applied to each configuration in other embodiments or modifications. Some of the respective configurations in the embodiment or the modifications above may be omitted as appropriate within the scope not departing from the gist of an aspect of the present invention.

REFERENCE SIGNS LIST

6 . . . processing device
10 . . . body section
11 . . . slide drive unit (linear drive unit)
13 . . . article holding unit
14 . . . lifting drive unit (linear drive unit)
15 . . . first pivoting drive unit (pivoting drive unit)
16 . . . second pivoting drive unit (pivoting drive unit)
21 . . . traveling wheel
50 . . . vehicle controller (control unit)
62 . . . load port
70 . . . cross-traveling path (traveling path)
100 . . . overhead transport vehicle
M . . . article
R . . . grid-patterned rail (rail)
ST . . . passage

The invention claimed is:
1. An overhead transport vehicle capable of traveling along a rail arranged at least partially in a grid pattern, the overhead transport vehicle comprising:
an article holding unit configured to hold an article;
a linear drive unit configured to drive the article holding unit to move linearly;
a pivoting drive unit configured to drive the article holding unit to pivot horizontally;
a control unit configured to control the pivoting drive unit in accordance with orientation of the article held by the article holding unit and orientation of a load port on which the article is placed;

a traveling wheel configured to roll on the rail; and
a body section disposed below the rail and including the article holding unit, the linear drive unit, and the pivoting drive unit, wherein
the linear drive unit includes a lifting drive unit configured to raise and lower the article holding unit and a slide drive unit configured to slide and move the lifting drive unit,
the pivoting drive unit includes a first pivoting drive unit configured to horizontally pivot the slide drive unit and a second pivoting drive unit configured to horizontally pivot the article holding unit or the lifting drive unit, and
when the slide drive unit is horizontally pivoted by the first pivoting drive unit, the second pivoting drive unit, the lifting drive unit, and the article holding unit that are attached to a lower side of the slide drive unit are horizontally pivoted together.

2. The overhead transport vehicle according to claim 1, wherein
the first pivoting drive unit rotates the slide drive unit at intervals of 90 degrees, and
the second pivoting drive unit rotates the lifting drive unit within a range of 180 degrees.

3. The overhead transport vehicle according to claim 1, wherein
the control unit performs:
a first control of horizontally pivoting the article holding unit by a first angle such that the orientation of the article and the orientation of the load port are in a certain relation; and
a second control of horizontally pivoting the article holding unit by a second angle smaller than the first angle such that the orientation of the article is fine-tuned.

4. The overhead transport vehicle according to claim 3, wherein the control unit performs the first control during conveyance of the article to the load port, and performs the second control during unloading of the article onto the load port.

5. An overhead transport system comprising:
a plurality of processing devices disposed so as to be aligned along a passage on each of one side and the other side of the passage; and
an overhead transport vehicle capable of traveling along a rail arranged at least partially in a grid pattern, the overhead transport vehicle comprising:
an article holding unit configured to hold an article;
a linear drive unit configured to drive the article holding unit to move linearly;
a pivoting drive unit configured to drive the article holding unit to pivot horizontally;
a control unit configured to control the pivoting drive unit in accordance with orientation of the article held by the article holding unit and orientation of a load port on which the article is placed;
a traveling wheel configured to roll on the rail; and
a body section disposed below the rail and including the article holding unit, the linear drive unit, and the pivoting drive unit, wherein
the linear drive unit includes a lifting drive unit configured to raise and lower the article holding unit and a slide drive unit configured to slide and move the lifting drive unit,
the pivoting drive unit includes a first pivoting drive unit configured to horizontally pivot the slide drive unit and a second pivoting drive unit configured to horizontally pivot the article holding unit or the lifting drive unit, and
when the slide drive unit is horizontally pivoted by the first pivoting drive unit, the second pivoting drive unit, the lifting drive unit, and the article holding unit that are attached to a lower side of the slide drive unit are horizontally pivoted together, wherein
each of the processing devices includes the load port disposed on a side of the processing device closer to the passage, and
the overhead transport system includes a traveling path, serving as a path along which the overhead transport vehicle travels, extending across the passage and allowing the overhead transport vehicle to pass through above a pair of the load ports.

* * * * *